United States Patent
Huang et al.

(10) Patent No.: US 6,413,818 B1
(45) Date of Patent: Jul. 2, 2002

(54) METHOD FOR FORMING A CONTOURED FLOATING GATE CELL

(75) Inventors: Chin-Yi Huang, Pao Shan; Chih-Jen Huang; Yun Chang, both of Hsinchu County, all of (TW); James Hsu, Saratoga, CA (US); Samuel C. Pan, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/415,936

(22) Filed: Oct. 8, 1999

(51) Int. Cl.[7] ............................................. H01L 21/336
(52) U.S. Cl. ...................... 438/257; 438/263; 438/270; 438/593; 438/594
(58) Field of Search .............................. 438/211, 212, 438/257, 263, 264, 266, 267, 269, 270, 593, 594

(56) References Cited

U.S. PATENT DOCUMENTS

| 5,284,785 A | | 2/1994 | Gill .............................. 437/43 |
| 5,489,548 A | | 2/1996 | Nishioka et al. .............. 437/60 |
| 5,583,066 A | * | 12/1996 | Jung ........................... 438/259 |
| 5,661,055 A | * | 8/1997 | Hsu et al. .................... 438/259 |
| 5,677,216 A | * | 10/1997 | Tseng .......................... 438/259 |
| 5,680,345 A | * | 10/1997 | Hsu et al. .............. 365/185.01 |
| 5,696,019 A | | 12/1997 | Chang .......................... 437/67 |
| 5,739,566 A | * | 4/1998 | Ota .............................. 257/315 |
| 5,915,177 A | * | 6/1999 | Tseng .......................... 438/264 |
| 5,923,974 A | | 7/1999 | Liang et al. ................... 438/257 |
| 5,962,889 A | | 10/1999 | Yamauchi et al. ........... 257/317 |
| 6,002,151 A | * | 12/1999 | Liu et al. ..................... 257/316 |
| 6,054,733 A | | 4/2000 | Doan et al. .................. 257/315 |
| 6,069,040 A | | 5/2000 | Miles et al. .................. 438/260 |
| 6,124,167 A | * | 9/2000 | Kao et al. ..................... 438/257 |
| 6,130,140 A | | 10/2000 | Gonzalez ..................... 438/430 |
| 6,159,796 A | * | 12/2000 | Dietz et al. ................... 438/257 |

FOREIGN PATENT DOCUMENTS

| EP | 0495113 A1 | | 7/1992 |
| JP | 53-144692 | | 5/1977 |
| JP | 11274439 A | * | 9/1999 |

OTHER PUBLICATIONS

Kitamura et al. "A Low Voltage Operating Flash Memory Cell with High Coupling Ratio Using Horned Floating Gate with Fine HSG" 1998 Symposium on VLSI Technology Digest of Technical Papers, pp. 104–105.
Kobayashi et al. "A 0.24–$\mu m^2$ Cell Process with 0.18–$\mu m$ Width Isolation and 3–D Interpoly Dielectric Films for 1–Gb Flash Memories" IEDM 97–275, 3 pages.

* cited by examiner

Primary Examiner—Michael J. Sherry
Assistant Examiner—Asok Kumar Sarkar
(74) Attorney, Agent, or Firm—Mark A. Haynes; Haynes Beffel & Wolfeld LLP

(57) ABSTRACT

A floating gate having a first and second end region, each of which are positioned adjacent to a corresponding lateral end of the floating gate. A middle region is positioned laterally towards a middle of the floating gate relative to the first and second end regions. The first end region, the middle region and the second end region are formed of a same material during a single fabrication step, and the middle region formed has a thickness which is less than a thickness of the first or second end regions. This invention further includes a method for forming a contoured floating gate for use in a floating gate memory cell. The method includes forming a polysilicon layer over first and second spaced apart oxide structures and a floating gate region between the first and second oxide structures such that the polysilicon layer formed in the floating gate region has a first end region adjacent the first oxide structure, a second end region adjacent the second oxide structure, and a middle region positioned laterally between the first and second end regions. The method further includes removing a portion of the polysilicon layer in the floating gate region such that the vertical thickness of the first and second end regions remain greater than the vertical thickness of the middle region.

28 Claims, 13 Drawing Sheets

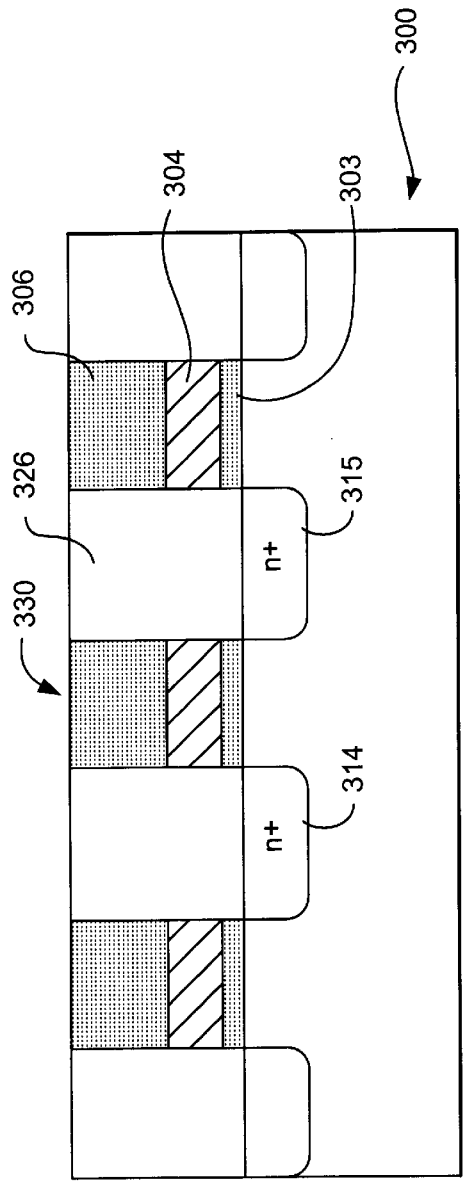
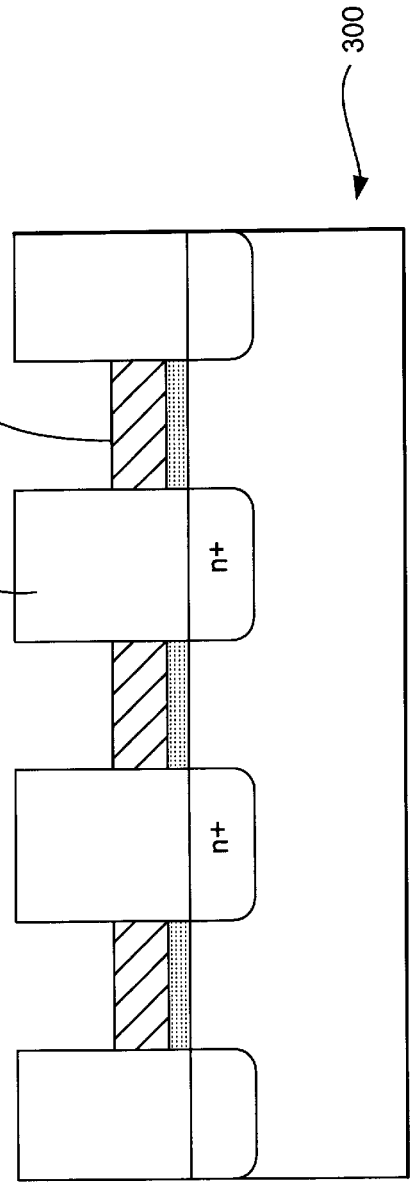
FIG. 3C
FIG. 3D

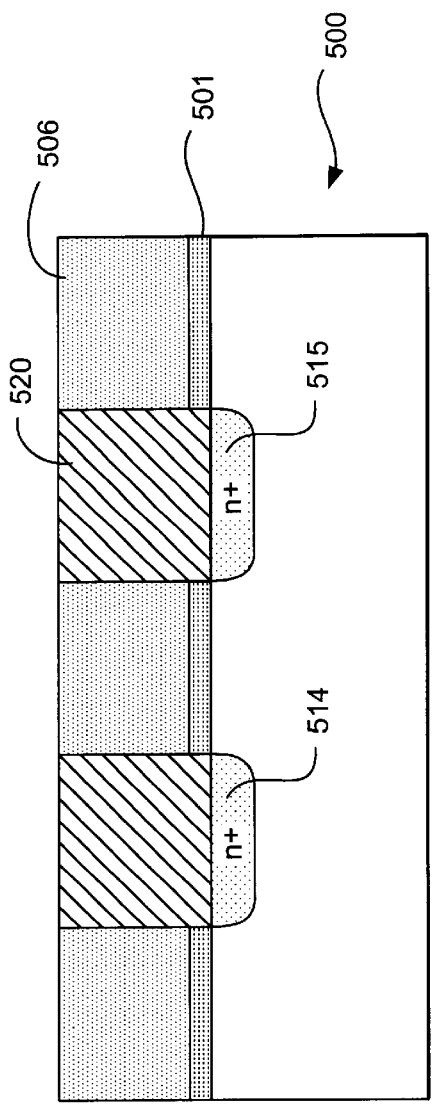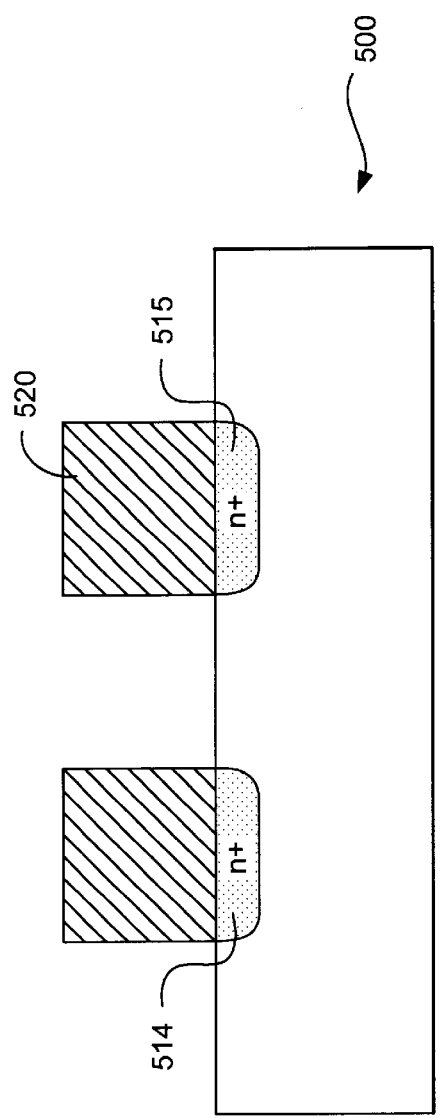
FIG. 5C
FIG. 5D

METHOD FOR FORMING A CONTOURED FLOATING GATE CELL

BACKGROUND OF THE INVENTION

1. Field of the Invention

The present invention relates to non-volatile digital memory, and more particularly, to FLASH EPROM memory incorporating novel floating gates having reduced lateral dimensions.

2. Description of Related Art

FLASH EPROM memory is a class of non-volatile storage integrated circuits. In general, FLASH EPROMS have the capability of electrically erasing, programming, or reading a memory cell on a chip. Generally, a FLASH EPROM includes a floating gate and a control gate which form an electrical connection. A FLASH EPROM operates by charging or discharging electrons in the floating gate of the memory cell in a capacitive manner. The floating gate is formed of a conductive material, typically made of polysilicon, which is insulated from the channel of the transistor by a layer of oxide or other insulating material, and insulated from the control gate or word-line of the transistor by a second layer of insulating material.

The act of charging the floating gate is termed a Aprogram@ step for a FLASH EPROM. The program step may be accomplished through so-called hot electron injection by establishing a large positive voltage between the control gate and the source. The act of discharging the floating gate is called the Aerase@ function for a FLASH EPROM. The erase function is typically carried out by a Fowler-Nordhiem F-N tunneling mechanism between the floating gate and the source of the transistor (source erase) or between the floating gate and the substrate (channel erase).

Due to increasing memory demands, a need exists to further reduce the size of memory devices, such as FLASH EPROMs. Reducing the cell size of memory devices increases performance and reduces power consumption.

Several devices have been developed with reduced cell size. One such device is described in "A Low Voltage Operating Flash Memory Cell with High Coupling Ratio Using Horned Floating Gate with Fine HSG," by Kitamura et al., 1998 *Symposium on VLSI Technology Digest of Technical Papers.* Another example of a memory device with reduced cell size is described in "A 0.24-Fm Cell Process With 0.18-Fm Width Isolation and 3D Interpoly Dielectric Films for 1-GB Flash Memories," by Kobayashi et al., IEEE 97–275 (1997).

Reducing the size of a memory cell has led to memory cells with certain disadvantages including overbearing floating gates, or intermediate structures formed during the manufacturing of the floating gate, which degrade the tunnel oxide layer. The formation of sharp corners on the floating gate also leads to charge leakage.

SUMMARY OF THE INVENTION

A floating gate for use in a memory cell is provided which comprises a first end region positioned adjacent to a first lateral end of the floating gate, a second end region positioned adjacent to a second lateral end of the floating gate, and a middle region positioned laterally towards a middle of the floating gate relative to the first end region and the second end region. The first end region, the middle region and the second end region are formed of a same material during a single fabrication step, and the middle region has a thickness which is less than a thickness of the first or second end regions.

According to another embodiment of the invention, a floating gate of a floating gate memory cell may include a first polysilicon layer formed during a first fabrication step, and a second polysilicon layer formed during a second fabrication over the first polysilicon layer. The second polysilicon layer may comprise a first end region positioned adjacent to a first lateral end of the floating gate, a second end region positioned adjacent to a second lateral end of the floating gate, and a middle region positioned laterally toward a middle of the floating gate relative to the first end region and the second end region.

In one variation, the first and second end regions each include an exterior surface forming an end of the floating gate, an interior surface adjacent to the middle region, a top end surface, and an interior surface adjacent to the middle region. In this embodiment, the end regions have a thickness that is substantially uniform between the exterior surface and the interior surface.

In another variation, the middle region may have a top surface that is substantially parallel to a substrate underlying the floating gate.

In another variation, the floating gate may have a bottom surface facing a plane of a substrate underlying the floating gate, where the floating gate is positioned substantially within a lateral footprint defined by the bottom surface of the floating gate.

In another variation, the floating gate is formed of a first layer of material formed during a first fabrication step, and a second layer of material formed over the first layer during a second fabrication step. Alternatively, the entire floating gate is formed during a single fabrication step.

Variations of the floating gate may also provide for the first exterior surfaces to be approximately perpendicular to the top end surfaces of the end regions, so that the interior surfaces are approximately perpendicular to the tangent plane to the top end surfaces of the end regions.

In regard to each of the above floating gate embodiments, the floating gate may be incorporated into a floating gate memory cell including a substrate, source and drain regions positioned over the substrate, and an insulating layer positioned over the source and drain regions. The floating gate is positioned over the insulating layer between the source and drain regions, and a control gate is positioned over the dielectric insulator.

Also provided according to the present invention are methods for fabricating the floating gates of the present invention. According to one embodiment, a method for forming a contoured floating gate for use in a floating gate memory cell is provided which includes forming a polysilicon layer over first and second spaced apart oxide structures, and over a floating gate region between the first and second oxide structures. The polysilicon layer formed in the floating gate region has a first end region adjacent the first oxide structure, a second end region adjacent the second oxide structure, and a middle region positioned laterally between the first and second end regions, the first and second end regions each having a vertical thickness greater than a vertical thickness of the middle region. The method further includes removing a portion of the polysilicon layer in the floating gate region such that the vertical thickness of the first and second end regions remain greater than the vertical thickness of the middle region.

In another variation, the method further includes removing a portion of the first and second oxide structures so that the first end region and the second end region extend vertically beyond a top surface of the first and second oxide structures.

In another variation, forming a polysilicon layer over first and second oxide structures and a floating gate region includes forming the end regions to have a substantially uniform thickness between the exterior surfaces and the respective interior surfaces.

In another variation, removing the polysilicon layer over the first and second oxide structures includes planarizing the first oxide structure, second oxide structure, first end region and second end region.

In another method for fabricating a floating gate according to this invention, the method includes forming a first polysilicon layer in a floating gate region of a substrate. The method further includes forming oxide structures on opposing sides of the floating gate region, the first and second oxide structures having a vertical thickness greater than a vertical thickness of the first polysilicon layer. A second polysilicon layer is then formed over the first polysilicon layer and the oxide structures. The first and second polysilicon layers combine to form a floating gate in the floating gate region, the floating gate having a first end region adjacent to the first lateral end, a second end region adjacent to the second lateral end, and a middle region positioned laterally towards a middle of the floating gate relative to the first and second end regions, wherein the first end region and the second end region have a vertical thickness greater than a vertical thickness of the middle region. The method further includes removing the second polysilicon layer over the first and second oxide structures to form the contoured floating gate.

In one variation, the method further includes removing a portion of the first and second oxide structures so that the end regions of the floating gate extend vertically beyond a top surface of the oxide structures.

In another variation, forming the second polysilicon layer over the first and second oxide structures and the first polysilicon layer includes forming upper end regions of the floating gate to include an exterior surface, a top end surface adjacent the exterior surface, where the end regions have a substantially uniform thickness between the exterior surfaces and the respective interior surfaces.

In another variation, forming the second polysilicon layer over the first and second oxide structures and the first polysilicon layer includes planarizing the first oxide structure, second oxide structure, first end region and the second end region.

Each of the above methods may be used to form a floating gate memory cell in a method. The methods include providing a substrate, forming source and drain regions over the substrate, depositing an insulating layer over the source and drain regions, and forming a contoured floating gate positioned over the insulating layer between the source and drain regions.

BRIEF DESCRIPTION OF THE FIGURES

FIGS. 3A–3I illustrate an embodiment of a process for fabricating a memory cell according to the present invention.

FIG. 3A illustrates a masking layer, polysilicon layer and a tunnel oxide layer used for fabricating the memory cell.

FIG. 3B illustrates the polysilicon layer and masking layer being etched away to form a pattern.

FIG. 3C illustrates oxide structures being deposited between the columns so that each column is abutted by an oxide structure.

FIG. 3D illustrates the masking layer being removed to create a step topography between the polysilicon layer and the oxide structure.

FIG. 3E illustrates a second polysilicon layer deposited over the step topography comprising the columns and the oxide structures.

FIG. 3F illustrates the second polysilicon layer etched back to selectively remove all of the second polysilicon layer on top of the oxide structures.

FIG. 3G illustrates the oxide structure dipped back to shorten the top surface of the oxide structure and to form a contoured top or coupling surface on upper portions of the combined polysilicon layers.

FIG. 3H illustrates the interdielectric layer deposited over the polysilicon layer and the oxide structure.

FIG. 3I illustrates completion of the memory cell with deposition of another polysilicon layer over the dielectric layer.

FIGS. 5A–5H illustrate an embodiment of a process for fabricating a memory cell according to the present invention FIG. 5A illustrates a combination of a polysilicon layer, masking layer, and tunnel oxide layer used for fabricating a memory cell; masking layer grown over a sacrificial oxide layer.

FIG. 5B illustrates the masking layer being etched away to form a pattern of columns.

FIG. 5C illustrates oxide structures being deposited between the columns so that each column is abutted by an oxide structure.

FIG. 5D illustrates the masking layer being removed to create a step topography between the oxide structures.

FIG. 5E illustrates a polysilicon layer deposited over the step topography comprising the oxide structures.

FIG. 5F illustrates the polysilicon layer etched back to selectively remove all of the polysilicon layer on top of the oxide structures.

FIG. 5G illustrates the oxide structure dipped back to shorten the top surface of the oxide structure and to form a contoured top or coupling surface on upper portions of the polysilicon layer.

FIG. 5H illustrates an interdielectric layer deposited over the polysilicon layer and the oxide structures.

DETAILED DESCRIPTION

The present invention relates to a flash memory cell design providing a reduced lateral dimension by incorporating into a floating gate a contoured three-dimensional coupling surface. The contoured coupling surface is created by fabricating material for forming the floating gate such that it varies in thickness across its lateral dimension. The floating gate is shaped by the fabrication process.

As will be described in greater detail below, use of a floating gate according to embodiments of the present invention provides significant advantages in that a smaller memory cell is provided with comparable performance to other FLASH EPROM memory cells known in the art which have larger dimensions. Among other advantages, the memory cell of the present invention is inexpensive to manufacture, and avoids leakage of electrical charge from the floating gate.

Figure 1:
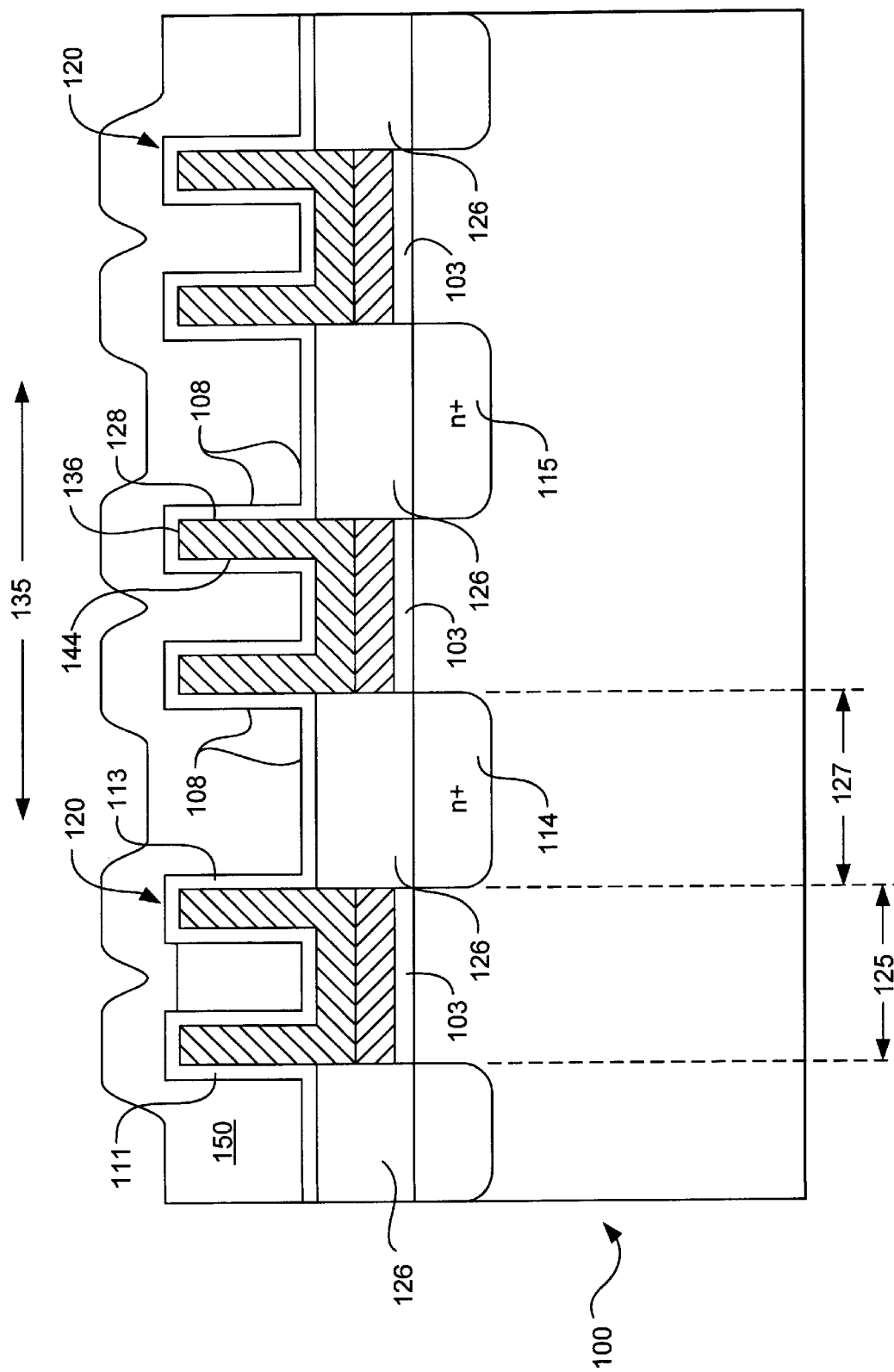
FIG. 1 illustrates a memory cell according to the present invention.

FIG. 1 illustrates memory cells according to the invention aligned in a column to form a memory array of FLASH EPROM device. The memory cells in the column share a semiconductor substrate 100. The particular design or formation of the semiconductor substrate 100 may be varied depending on the memory device architecture. For example, for the source-drain-source configuration shown in FIG. 6, the semiconductor substrate 100 may be of a p-type. An n+-type source 114 and n+-type drain region 115 may be distributed over the substrate 100. Preferably, a plurality of oxide structures 126 are each contained over an oxide region 127 of the substrate 100. A plurality of floating gates 120 are formed between the oxide structures 126, with each floating gate 120 positioned over a corresponding floating gate region 125 of the substrate 100. In an embodiment, the floating gates 120 abut the oxide structures 126 at respective first and second lateral ends 111 and 113. An insulative layer such as a tunnel oxide layer 103 may separate the substrate 100, the floating gate 120, and possibly the oxide layer 126. Preferably, the source and drain regions 114 and 115 are each positioned substantially underneath one of the oxide structures 126.

The floating gates 120 extend laterally in a word line direction, as shown by the directional arrow 135. Additional floating gates 120 aligned in a bit line direction extending into the paper are not shown. Each floating gate 120 is formed from a polysilicon body having a vertical thickness in one or more regions that is greater than a vertical thickness of the oxide structure 126. As will be detailed below, the floating gates of the first preferred embodiment include a polysilicon body having a contoured or three-dimensional coupling surface that includes a recessed region and one or more raised ends or plateaus.

As illustrated, the floating gate memory cell may further include an interpolysilicon dielectric 108 deposited over the oxide structures 126 and the floating gate 120. A third layer of polysilicon 150 is deposited over the interpolysilicon dielectric 108 to form the word-line control gate. As a result of the shapes of the respective floating gates 120 and oxide structures 126, the deposition of the polysilicon layer over the interpolysilicon dielectric forms trenches in alignment over the oxide layers and floating gates.

Figure 2:
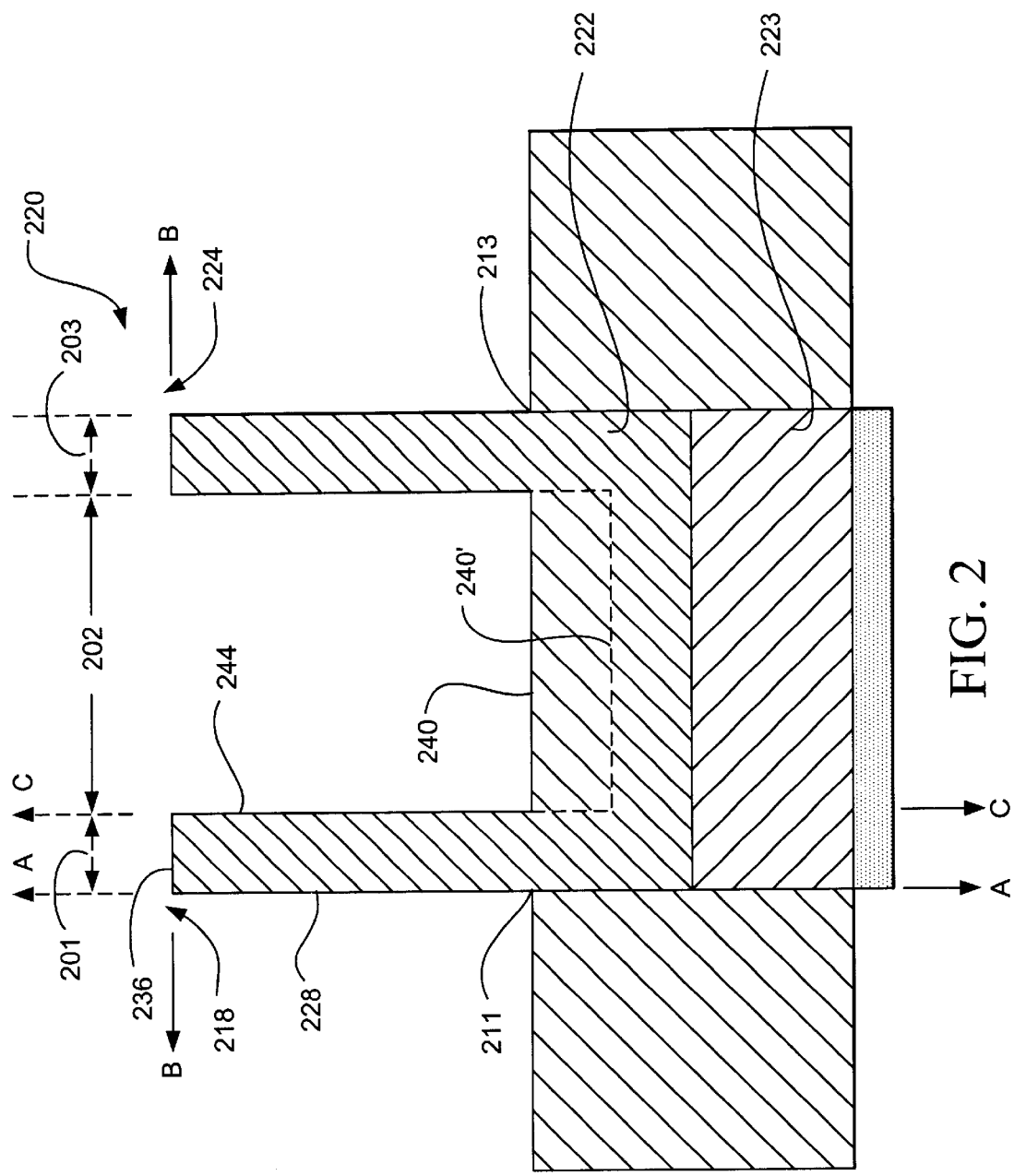
FIG. 2 illustrates an embodiment of a memory cell of the present invention, with variations to the top surface of the floating gate shown in phantom.

The design of floating gates used in the present invention will now be described in greater detail. FIG. 2 illustrates an embodiment of a floating gate 220 according to the present invention. As illustrated, the floating gate 220 may be divided into three regions moving left to right: a first end region 201 positioned adjacent to a first lateral end 211, a second end region 203 positioned adjacent to a second lateral end 213, and a middle region 202 positioned laterally towards a middle of the floating gate with respect to the lateral ends 211 and 213. The thickness of the floating gate 220 may vary between different regions to create a top coupling surface with a contoured topography. In the contoured topography, the first and second end regions form first and second raised ends 218 and 224. The floating gate at the middle region 202 is vertically thinner than the end regions and thus forms a recessed middle surface 240. The floating gate 220 may be formed from a top and bottom polysilicon layer 222 and 223, although additional polysilicon layers may also be included in the floating gate 120. The bottom polysilicon layer 223 extends between oxide layers 226 and abuts the tunnel oxide layer 103 over the substrate 100. In one embodiment, the top polysilicon layer 222, and more specifically on upper portions of the top polysilicon layer 222, is contoured to provide the coupling surface of the floating gate 120.

Preferably, the first and second raised ends 218 and 224 are substantially identical, so that discussion of the first raised end 218 is applicable to the second raised end 224 as well. The vertical thickness of the raised end 218 is substantially uniform, so that the raised end 218 is defined by an oxide border 228 that is substantially vertical with respect to the oxide layer 126 (FIG. 1), a top end surface or plateau 236 that is substantially perpendicular to the oxide border 228 and/or horizontal with the substrate 100, and an inward vertical surface 244 that extends from the top end surface 236 to the middle surface 240. In a preferred embodiment, the inward vertical surface 244 is substantially perpendicular to both the top end surface 236 and the recessed middle surface 240. For purposes of discussion, the oxide border 228, top end surface 236, and inward surface 244 may be represented by respective tangent planes A, B, and C. The tangent planes A, B and C may be referenced with respect to any linear shaped portion of the corresponding floating gate surface. With this reference, the angle formed between plane A and the oxide structure 226, planes A and B, planes B and C, and plane C and the middle surface 240 are each approximately 90 degrees. The juncture or connecting segment of the respective oxide border 228, top end surface 236, and inward vertical surface 244 may be edged, rounded, or otherwise smoothed or shaped. The depth of the floating gate at the middle region may vary, as shown by middle surface 240', so that the thickness of the middle region 202 is greater or less than the height of the oxide structures 226. The thickness of the middle region relative to the oxide structure may vary according to the extent of an oxide dip back, as illustrated in FIG. 3C. Additional raised ends or walls may be integrated or formed into the floating gate to increase the surface area and the coupling ratio between the floating gate 220 and control gate.

One advantage of this invention includes providing the floating gate 120 with an increased coupling surface. The contoured coupling surface, as exemplified in the embodiment of the above description, may compare the sum of the lengths of the oxide border 228, top end surface 236, inward vertical surface 244, and recessed middle surface 240. The sum total of the contoured coupling surface represents a relative increase with respect to the known art. The increase in coupling surface correlates directly with the coupling ratio between the floating gate and control gate, and allows for the floating gate to occupy less real estate on the substrate 100, thereby reducing the overall size of the memory cell. Moreover, the operational voltage of the FLASH EPROM can be reduced and the circuitry can be simplified. Another advantage of reducing the size of the floating gate is that the present invention avoids floating gate structures comprising polywings or laterally spanning floating gates that extend and vertically overlap with the source/drain diffusion regions. As such, the cell structure of the present invention can reduce drain coupling ratio and drain leakage when the cell is being programmed. Likewise, the cell structure of the present invention can reduce source coupling ratio during F-N erase operations.

Referring to FIG. 2, the vertical thickness of the floating gate at the first and second end regions 201 and 203 may optionally range between 100 and 10,000 Angstroms, and preferably between 1200 and 4000 Angstroms. The vertical thickness of the middle region 202 of the floating gate may optionally range between 0 and 10,000 Angstroms and preferably between 0 and 3600 Angstroms. The vertical thickness of the top polysilicon layer 222 may optionally range between 100 and 2000 Angstroms, and preferably between 300 and 1000. The bottom polysilicon layer 223 optionally ranges between 50 and 2000 Angstroms, and preferably between 400 and 1000 Angstroms. The thickness of the oxide structure 226 is preferably under 4000 Angstroms. The tunnel oxide layer 103 preferably ranges between 50 and 300 Angstroms. The lateral length of the first and second end regions 201 and 203 preferably ranges between 100 and 2000 Angstroms, and preferably between 300 and 1000 Angstroms. The lateral length of the middle region 202 preferably ranges between 100 and 6000 Angstroms, and preferably between 1000 and 5000 Angstroms.

Figure 3A:
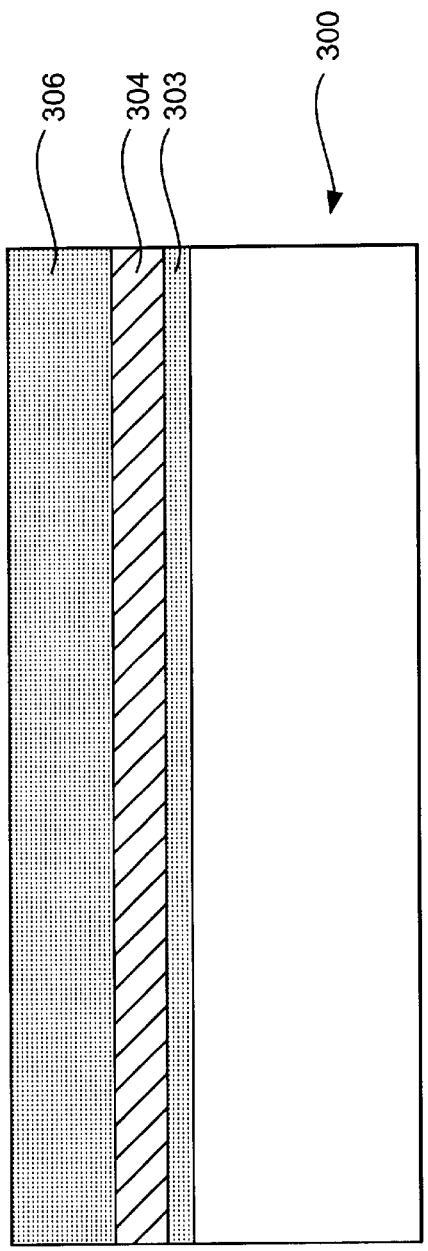

FIGS. 3A–3I illustrate a first embodiment for fabricating a memory cell according to the present invention and more specifically, an array of floating gates. As illustrated in FIG. 3A, a relatively thin tunnel oxide layer 303 is grown over a substrate 300 to preferably approximately 100 Angstroms in thickness. In an embodiment such as the one shown by FIG. 6, the substrate includes a p-type substrate. Next, a conductive layer for forming a floating gate such as a first polysilicon layer 304 is deposited over the tunnel oxide layer 303. An insulative or masking layer 306 comprised of material such as silicon nitride ($Si_3N_4$) is sequentially deposited over the first polysilicon layer 304. The masking layer 306 may be formed on the tunnel oxide layer 303 by low pressure chemical vapor deposition (LPCVD) or plasma enhance chemical vapor deposition (PECVD).

Figure 3B:
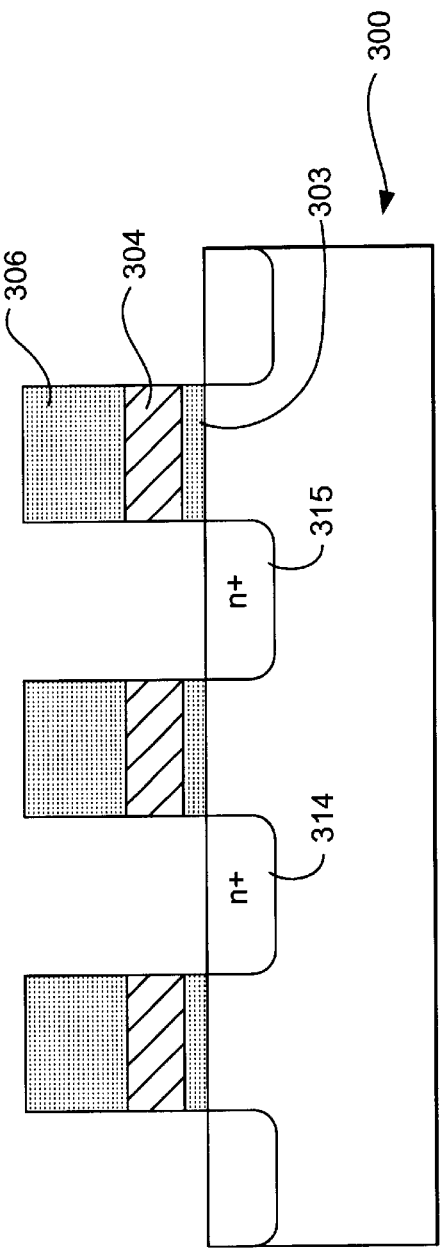

As illustrated in FIG. 3B, the first polysilicon layer 304 and masking layer 306 are etched away to form a pattern of polysilicon-nitride columns spaced apart over the substrate 300. Preferably, the columns are defined by a photo masking process. In this step, dopants are used to create diffusion regions 314 and 315 between the columns 330. This may be accomplished using conventional ion implantation methods, although chemical or other similar processes may also be employed. Preferably, an n-type dopant employed to create the diffusion regions, is implanted into the substrate 300.

FIG. 3C illustrates an oxide structure 326 being deposited in between the individual polysilicon-nitride columns. Next, the polysilicon-nitride columns and oxide layers 326 are planarized, preferably by chemical mechanical polishing means (CMP). Planarization causes the oxide structure 326 to be flush with the masking layer 306 of the columns against a horizontal plane. Alternative methods for planarizing the oxide structure 326 and masking layer 306 include etching back the oxide structure to be flush with the masking layer 306. The oxide structures 326 serve to insulate the polysilicon layers 304 from electron leakage, while also providing an alignment structure that will determine the height of a subsequent polysilicon deposition (shown in step 3D). As such, the height of the oxide structure 326 may be used to determine the height of the floating gate as a whole. The oxide structure 326 may be deposited onto the substrate 300 by numerous methods, including LPCFD, PECVD, and high-density plasma CVD (HDPCVD).

As illustrated in FIG. 3D, the masking layer 306 is removed from the polysilicon-nitride columns by a wet etching process to expose the first polysilicon layer 304 in between oxide structure 326. The resulting structure has a step-topography that forms an alignment structure for subsequent deposition of additional polysilicon layers.

Figure 3E:
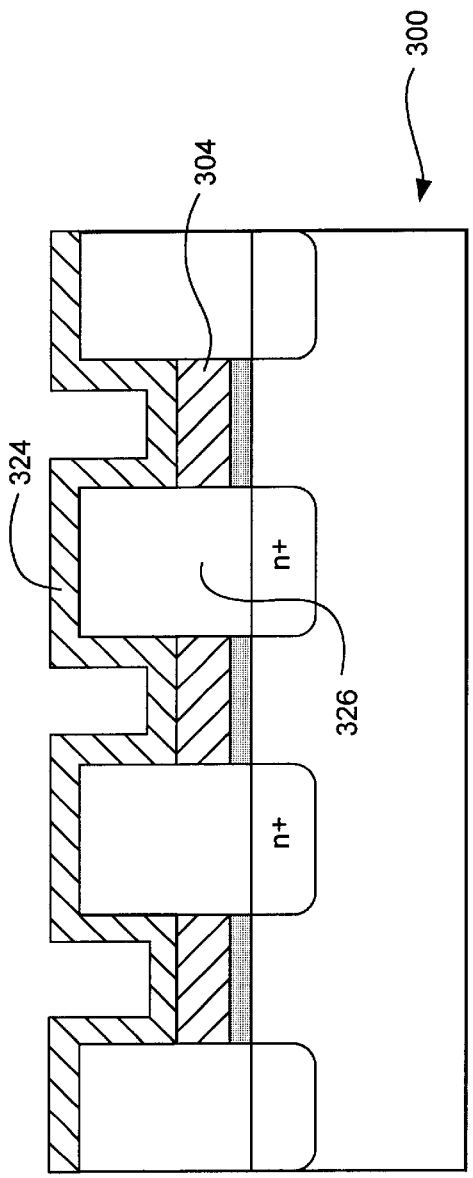

Next, FIG. 3E shows a second layer of polysilicon 324 being deposited over the first polysilicon layer 304 and oxide structure 326. The second polysilicon layer 324 continuously extends over the oxide structure 326 and the first polysilicon layer 304. As can be seen, the combined first and second polysilicon layers 304 and 324 are thickest adjacent the oxide structures 326. Accordingly, the oxide structures 326 cause the contours of the floating gate to be formed during the polysilicon fabrication process.

The second polysilicon layer 324 may be used to form the contours of the floating gate. While FIG. 3E shows the second polysilicon layer 324 is deposited such that it forms sharp 90 degree angles, the second polysilicon layer 324 may also be deposited to form more rounded corners.

Figure 3F:
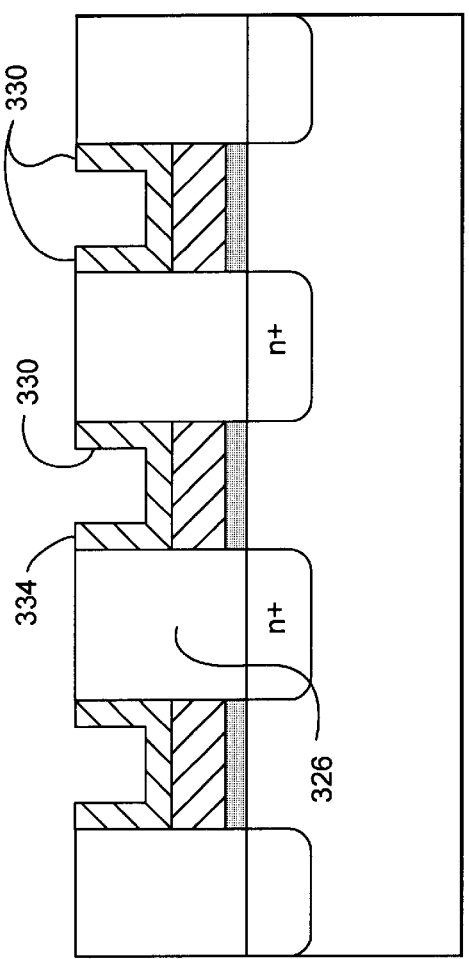

As illustrated in FIG. 3F, the second polysilicon layer 324 is removed from the top of the oxide layer 326, preferably through a CMP process. Alternatively, the second polysilicon layer 324 may be removed by dry etching, provided a film is used to separate the first polysilicon layer 304 from the second polysilicon layer 324. The second polysilicon layer 324 has raised ends 334 extending a thickness adjacent to the oxide structures 326. Preferably, the space defined by the oxide structures 326 is a rectangular recess.

Figure 3G:
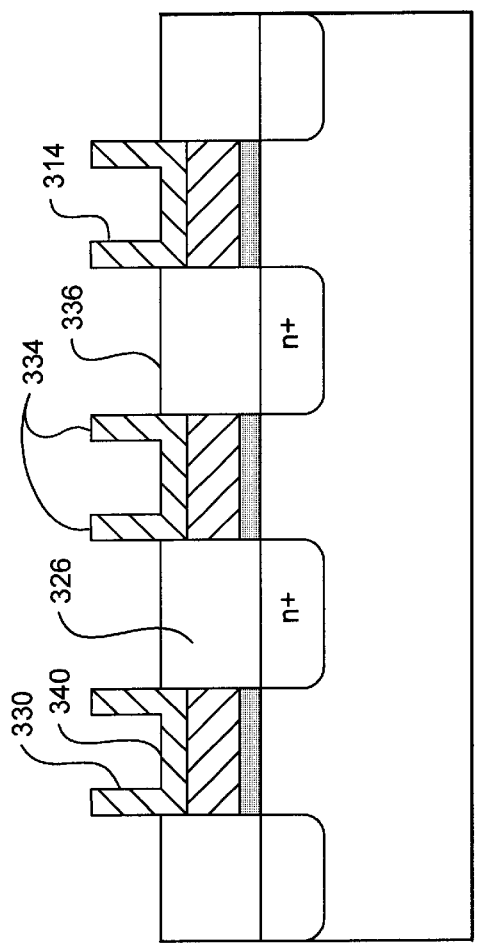

As illustrated in FIG. 3G, the oxide structure 326 is dipped back to provide a top new surface 336 below the raised ends 334 of the second polysilicon layer 324. Preferably, a recessed middle surface 340 of the polysilicon structure is coplanar or above the top oxide surface 336. The height of the oxide structure 326 after being dipped back is preferably between 100 to 5000 Angstroms. Likewise, the height for the vertical layers 330 is preferably between 100 and 10,000 Angstroms.

Figure 3H:
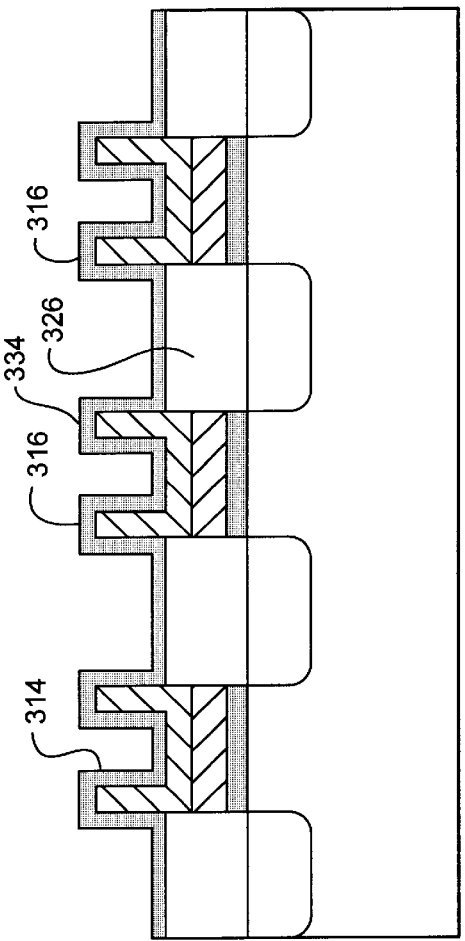

As illustrated in FIG. 3H, a dielectric layer 316 is deposited over the second polysilicon layer 324 and oxide structure 326. In a preferred embodiment, the dielectric layer 316 comprises an oxide-nitride-oxide layer with a thickness ranging between 50 to 500 Angstroms.

Figure 3I:
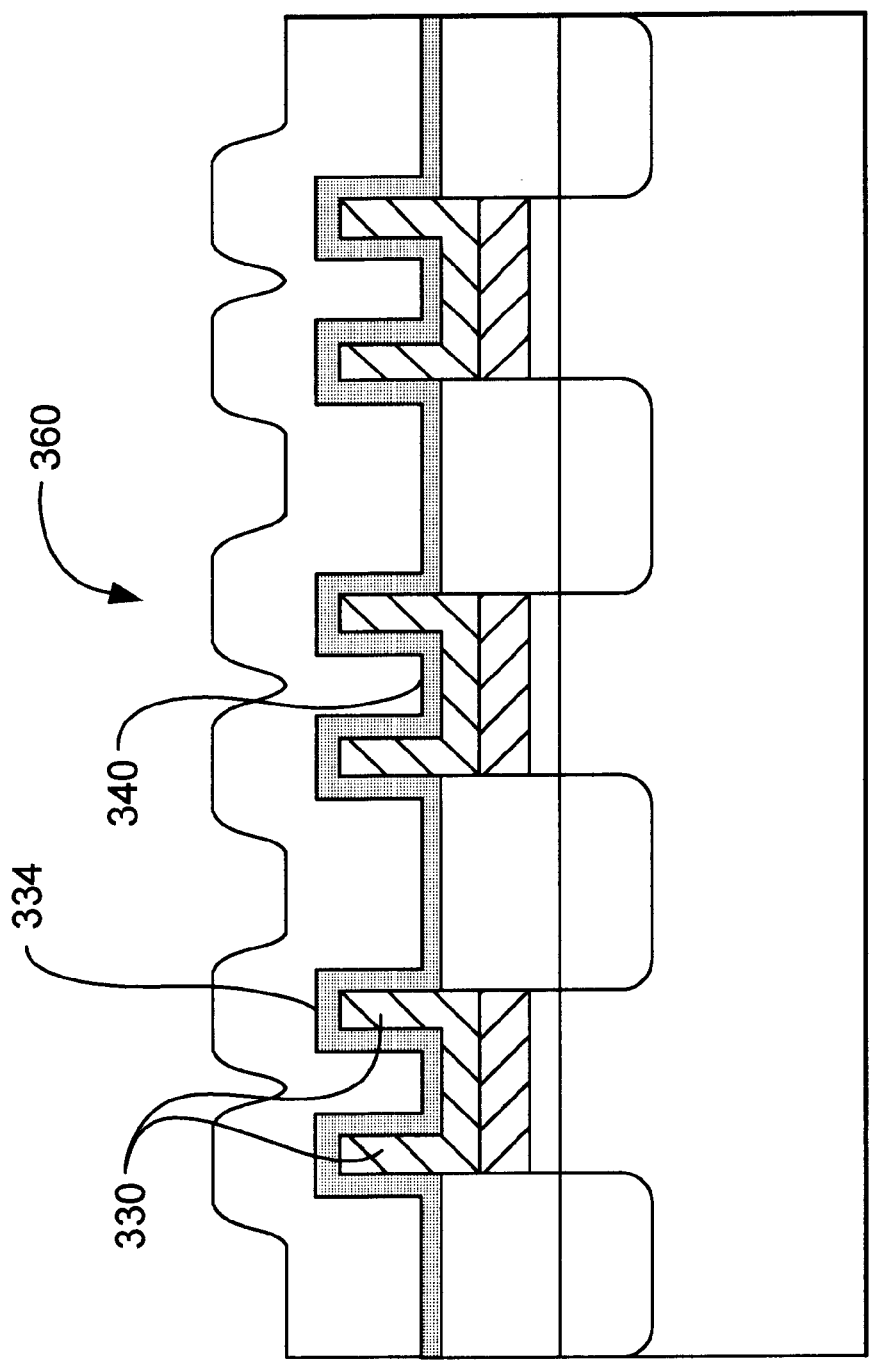

As illustrated in FIG. 3I, a third layer of polysilicon 360 is deposited as word-line gate control. In this manner, the coupling surface for each floating gate is defined by the raised ends 334 and recessed middle surface 340. The raised ends 334 provide an oxide border 128, a top end surface 136, and the inward vertical surface 144 shown in FIG. 1. The third polysilicon layer 360 may comprise polysilicon similar to the first and second layer, or alternatively comprise amorphous polysilicon.

Several other advantages of the present invention are attainable as a result of using self-aligning structures. Among other advantages, self-aligning the second polysilicon layer avoids extending a conductive layer over the region of the substrate containing the diffusion regions. This reduces drain coupling and therefore increases the coupling between the floating gate and the control gate.

Figure 4:
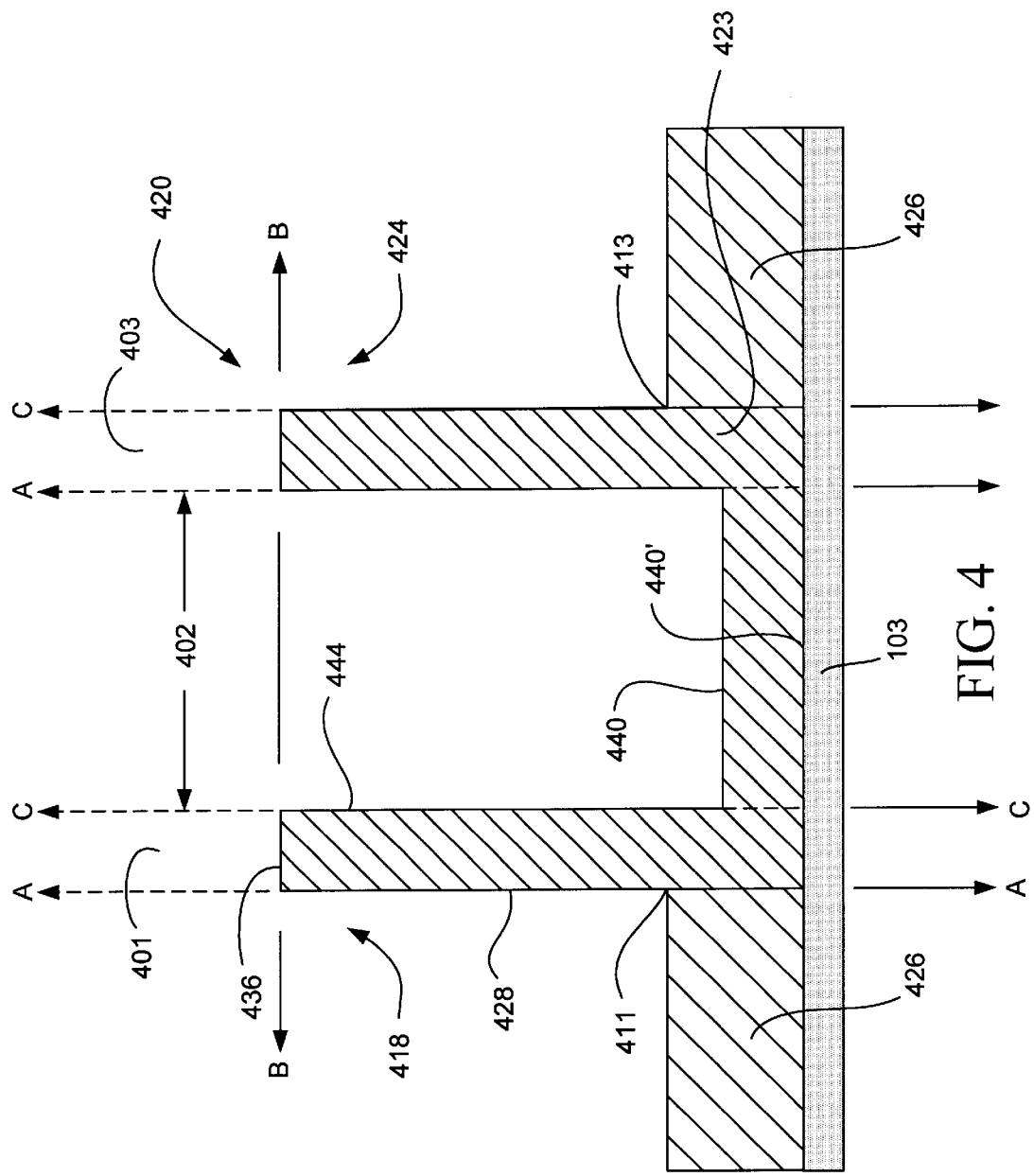
FIG. 4 illustrates another embodiment of a memory cell of the present invention, with variations to the top surface of the floating gate shown in phantom.

Another design of floating gates used in the present invention will now be described in greater detail. FIG. 4 illustrates another embodiment of a floating gate 420 according to the present invention. As illustrated, the floating gate 420 may be divided into three regions moving left to right: a first end region 401 positioned adjacent to a first lateral end 411, a second end region 403 positioned adjacent to a second lateral end 413, and a middle region 402 positioned laterally towards a middle of the floating gate with respect to the lateral ends 411 and 413. The thickness of the floating gate 420 may vary between different regions to create a top coupling surface with a contoured topography. In the contoured topography, the first and second end regions form first and second raised ends 418 and 424. The floating gate at the middle region 402 is vertically thinner than at the end regions 401, 403 and thus forms a recessed middle surface 440. The floating gate 420 may be formed in a single fabrication step to compose a single polysilicon layer 423. The polysilicon layer 423 extends between oxide layers 426 and abuts the tunnel oxide layer 103 over the substrate 100 (as shown in FIG. 1).

Preferably, the first and second raised ends 418 and 424 are substantially identical, so that discussion of the first raised end 418 is applicable to the second raised end 424 as well. The raised end 418 is defined by at least three floating gate surfaces, including an oxide border 428 that may be substantially vertical with respect to the oxide structure 126 (FIG. 1), a top end surface or plateau 436 that is substantially perpendicular to the oxide border 428 and/or horizontal with the substrate 100, and an inward vertical surface 444 that extends from the top end surface 436 to the middle surface 440. As with previous embodiments, the thickness of the raised end 418 is substantially uniform between the oxide border 428 and the inward vertical surface 444. For purposes of discussion, the oxide border 428, top end surface 436, and inward surface 444 may be represented by respective tangent planes A, B, and C. With this reference, the junctures or connecting segments formed between plane A and the oxide structure 426, planes A and B, planes B and C, and plane C and the middle surface 440 are preferably each approximately 90 degrees. The tangent planes A, B, and C may be referenced with respect to any linear shaped portion of the corresponding floating gate surface, so that the respective junctures may be edged, rounded, or otherwise smoothed or shaped. The depth of the floating gate at the middle region may vary, as shown by middle surface 440', so that the thickness of the middle region is greater or less than the height of the oxide structures 426. Additional raised ends or walls may be integrated or formed into the floating gate to increase the surface area and the coupling ratio between the floating gate 420 and control gate.

As with the previous embodiments, one advantage of this invention includes providing the floating gate 420 with an increased coupling surface. The contoured coupling surface, as exemplified in the embodiment of the above description may compare the sum of the lengths of the oxide border 428, top end surface 436, inward vertical surface 444, and recessed middle surface 440, which represents an increase in coupling surface with respect to the known art.

Referring to FIG. 4, the vertical thickness of the floating gate at the first and second end regions 401 and 403 may optionally range between 100 and 10,000 Angstroms, and preferably between 1200 and 4000 Angstroms. The vertical thickness of the middle region 402 of the floating gate may optionally range between 0 and 10,000 Angstroms, and preferably between 0 and 3600 Angstroms. The tunnel oxide layer 103 preferably ranges between 40 and 300 Angstroms. The lateral length of the first end region 201 and second end region 203 preferably ranges between 100 and 2000 Angstroms, and preferably between 300 and 1000 Angstroms. The lateral length of the middle surface 202 preferably ranges between 100 and 6000 Angstroms, and preferably between 1000 and 5000 Angstroms.

FIGS. 5A–5H illustrate a method for fabricating a memory cell according to the present invention and more specifically to fabricating contoured floating gates of a material formed during a single fabrication step. In an embodiment such as the one shown by FIG. 6, the substrate includes a p-type substrate. In this embodiment, a sacrificial oxide layer 501 is formed over the substrate 500. An insulative or masking layer 510 such as $Si_3N_4$ is then deposited over the sacrificial oxide layer 501.

Figure 5A:
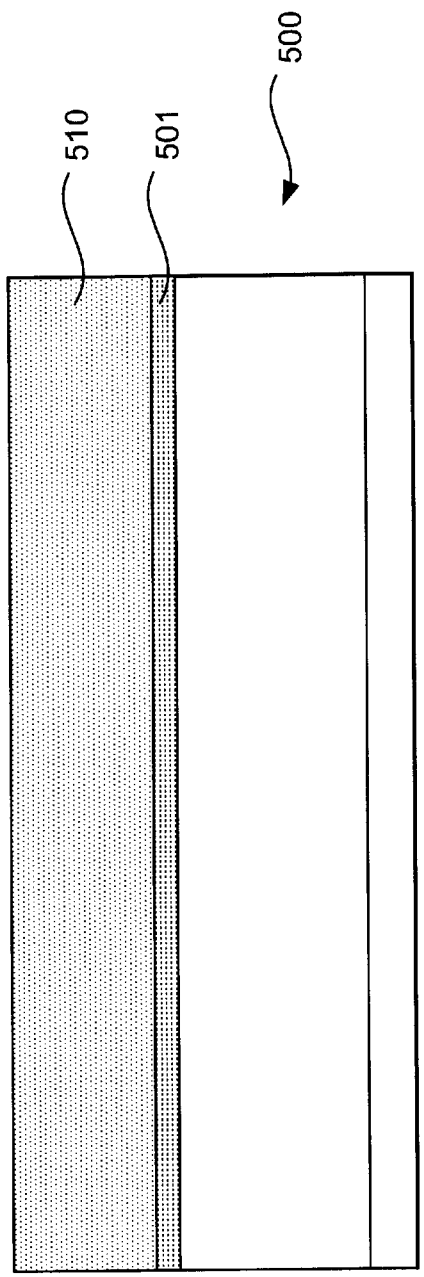
Figure 5B:
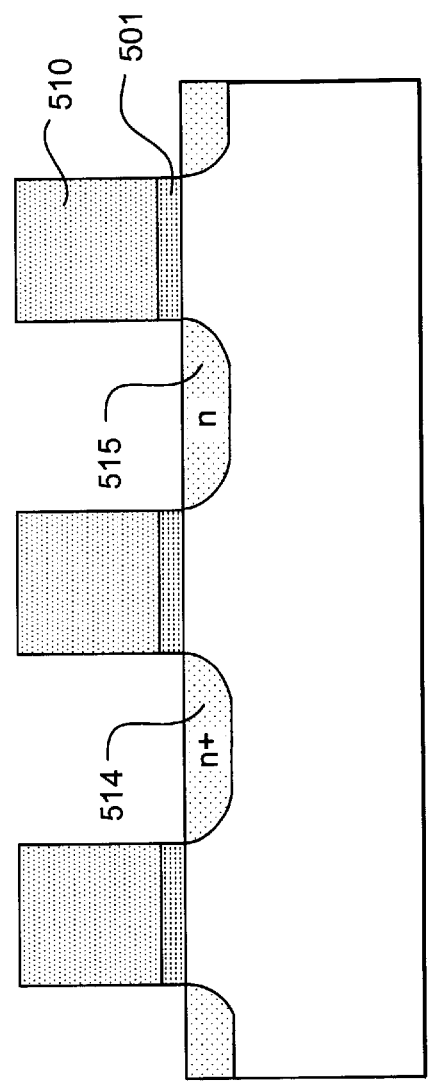

As illustrated in FIG. 5B, the masking layer 510 is etched away to form a pattern of masking columns spaced apart over the substrate 500. In this step, dopants are used to create diffusion regions 514 and 515 between the polysilicon nitride columns. This may be accomplished using conventional ion implantation methods, although chemical or other similar processes may also be employed. Preferably, an n-type dopant is employed to create the diffusion regions implanted into the substrate 500. A photo masking process may be used to define the source and drain diffusion regions.

FIG. 5C illustrates an oxide structure 520 deposited between the masking layer 510 and aligned over the source and diffusion regions 514 and 515. The oxide structure 520 is preferably formed from a CVD oxide. Once deposited, the oxide structure 520 and the masking layer 510 are planarized to be flush against the same horizontal plane. Preferably, the oxide structure 520 and the masking layer 510 are planarized by CMP, in which case the masking layer 510 may serve as a stop layer for planarization. Alternative methods for planarizing the oxide structure 520 and masking layer 510 include etching back the oxide structure 520. The oxide structure 520 may be used to provide an alignment structure for subsequent formation of a polysilicon layer. This allows the height of the oxide structure 520 to determine the height of the floating gate as a whole. The oxide structure may be deposited onto the substrate 500 by numerous methods, including LPCFD, PECVD, and HPCVD.

In FIG. 5D, the masking layer 510 is removed, preferably using a wet etch process. In addition, an oxide dip is performed to remove the sacrificial oxide layer 501. The resulting structure has a step-topography that forms an alignment structure for subsequent deposition of the additional polysilicon layer.

Figure 5E:
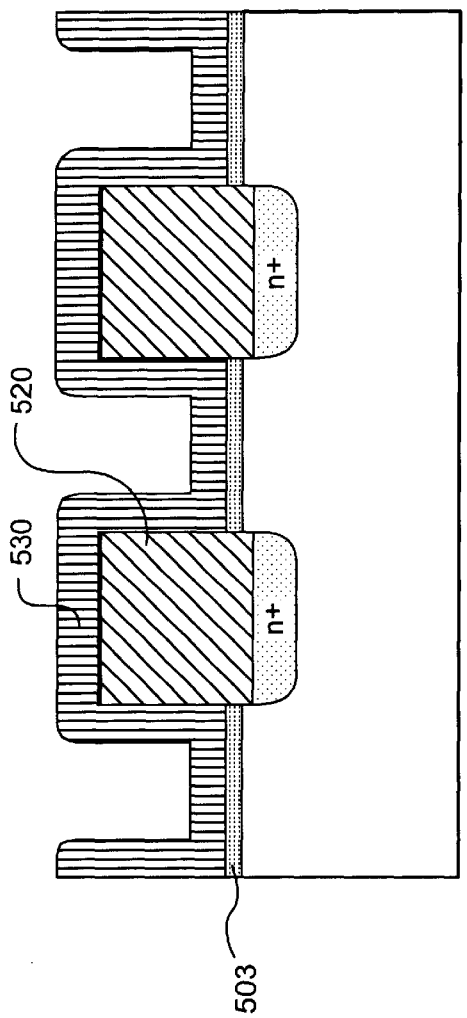

In FIG. 5E, a tunnel oxide layer 503 is grown over the substrate 500 in between the diffusion regions 514 and 515. A first layer of polysilicon 530 is then deposited over the substrate 500 and oxide structures 520. As shown by FIG. 5E, the polysilicon layer 530 aligns according to the step-topography provided over the substrate 500 by the oxide structures 520. As can be seen, the polysilicon layer 530 is thickest adjacent sides of oxide structures 520. Accordingly, the oxide structures 520 allow for the contoured floating gate to be formed during the polysilicon fabrication process.

Figure 5F:
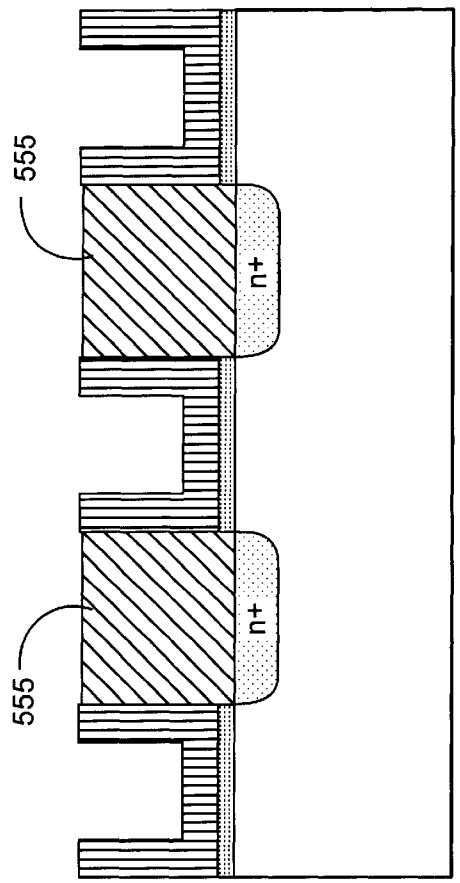

As illustrated by FIG. 5F, the polysilicon layer 530 is removed from a top surface 555 of the oxide structure 520. Preferably, the polysilicon layer 530 is removed by CMP.

Figure 5G:
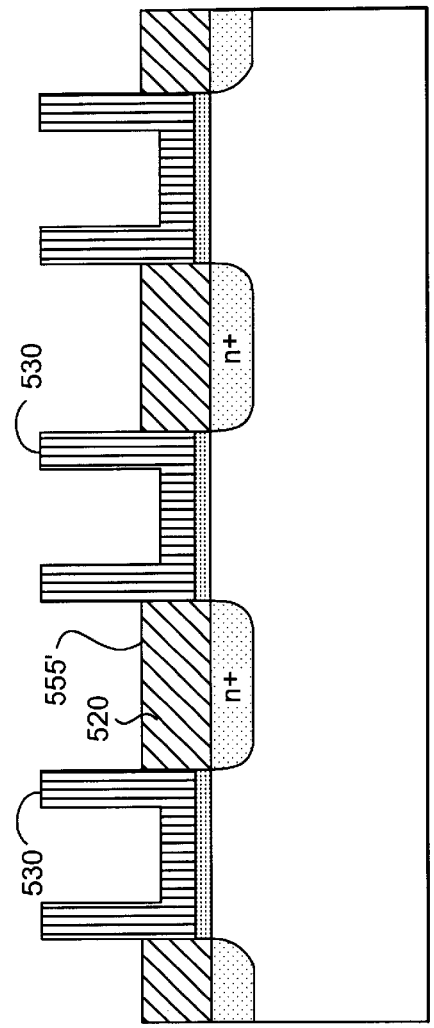

In FIG. 5G, the oxide structure is dipped back to form a new top surface 555'. The polysilicon layer 530 has formed vertical layers 535 in regions corresponding to the first and second end regions 401 and 403 of the floating gate in FIG. 4. Likewise, the middle surface 540 is recessed relative to the vertical layers 535, in accordance with the middle surface 440 of FIG. 4.

Figure 5H:
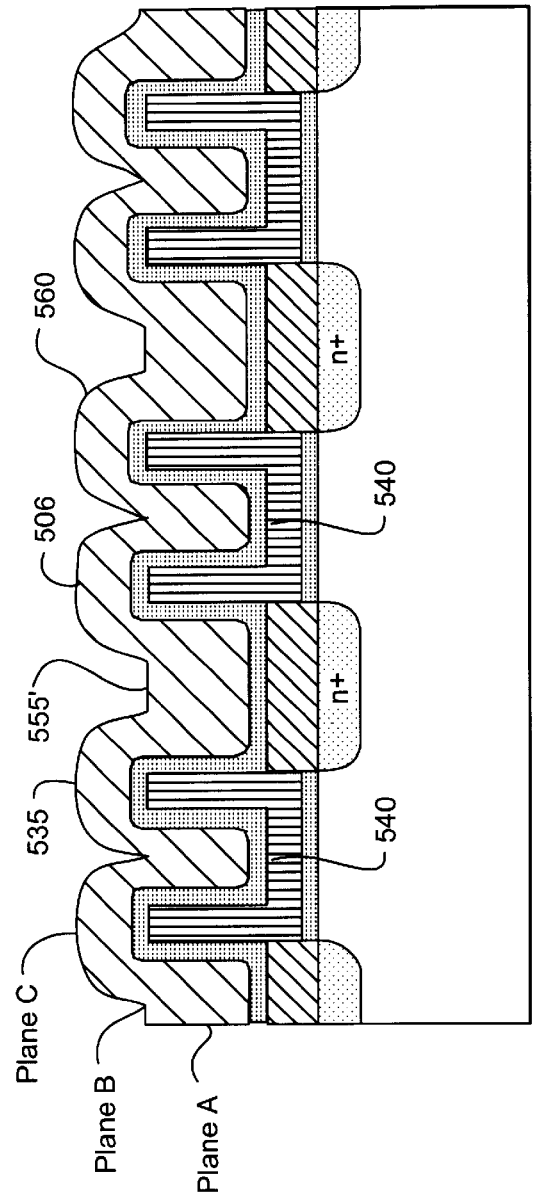

In FIG. 5H, a dielectric layer 506 and a second layer of polysilicon 560 are deposited as a word-line gate control. In this manner, the coupling surface for each floating gate is defined by the vertical layers 535 and recessed middle surface 540, where the vertical layers 535 of each polysilicon structure provide oxide border 428, top end surface 436, and the inward vertical surface 444 shown in FIG. 4. The second polysilicon layer 560 may comprise polysilicon similar to the first polysilicon layer, or alternatively comprise amorphous polysilicon. The resulting floating gate produced from this preferred method may increase the coupling surface available in the known art by more than two-fold.

Figure 6:
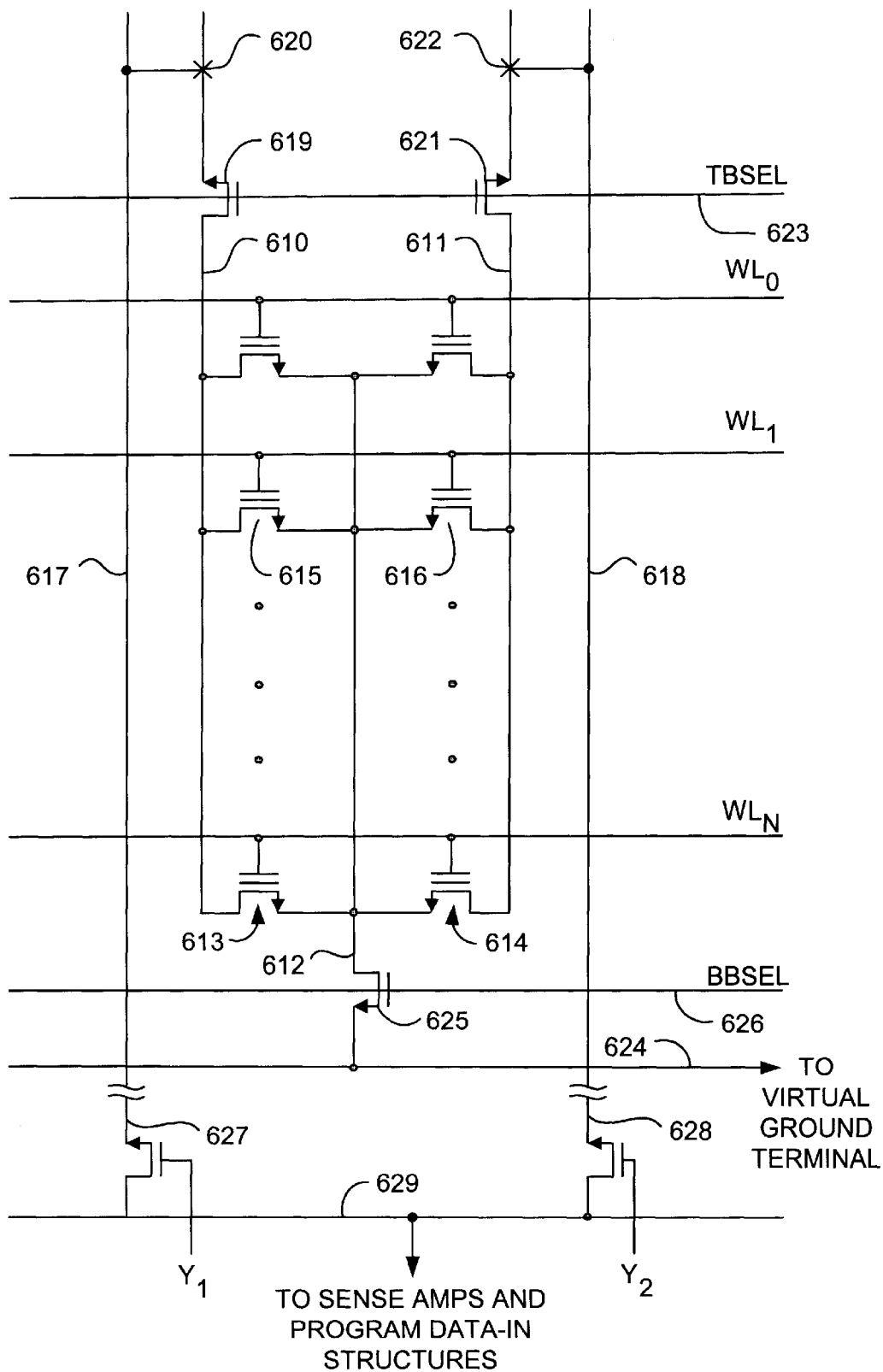
FIG. 6 illustrates a schematic of a non-volatile memory device that may be employed with this invention.

FIG. 6 illustrates the drain-source-drain configuration of the FLASH EPROM circuit according to the present invention. The circuit includes a first local bitline 610 and a second local bitline 611. The first and second local bitlines 610, 611 are implemented by buried diffusion conductors as described below. Also included is a local virtual ground line 612 implemented by buried diffusion. A plurality of floating gates, drains and sources are coupled to the local bitlines 610, 611 and local virtual ground line 612. The sources of the plurality transistors are coupled to the local virtual ground line 612. The drains of a first column of transistors, generally 613, are coupled to the first local bitline 610, and the drains of a second column of transistors, generally 614, are coupled to the second local bitline 611. The gates of the floating gate transistor are coupled to word-lines $WL_0$ through $WL_N$, where each word-line (e.g., $WL_1$) is coupled to the gate of a transistor (e.g., transistor 616) in the second column 614. Thus, transistors 615 and 616 can be considered a two transistor cell with a shared source diffusion.

A first global bitline 617 and a second global bitline 618 are associated with each drain-source-drain block as shown in FIG. 6. The first global bitline 617 is coupled to the source of top block select transistor 619 through a metal-to-diffusion contact 620. Similarly, the second bitline 618 is coupled to the source of top block select transistor 621 through a metal-to-diffusion contact 622. The drains of the top block select transistors 619, 621 are coupled to the first and second local bitlines 610 and 611 respectively. The gates of the top block selector transistors 619, 621 are controlled by a top block select signal TBSEL on line 623.

The local virtual ground line 612 is coupled to a virtual ground terminal across conductor 624 through bottom block selector transistor 625. The drain of the bottom block select transistor 625 is coupled to the local virtual ground line 612. The source of the bottom block select transistor 625 is coupled to the conductor 624. The gate of the bottom block select transistor 625 is controlled by a bottom block select signal BBSEL across line 626. In the preferred system, the conductor 624 is a buried diffusion conductor which extends to a metal-to-diffusion contact at a position displaced horizontally through the array, which provides contact to a vertical metal virtual ground bus.

The global bitlines extend vertically through the array to respective column select transistors 627, 628, through which a selected global bitline is coupled to sense amps and program data circuitry (not shown). Thus, the source of column select transistor 627 is coupled to global bitline 617, the gate of column select transistor 627 is coupled to a column decode signal $Y_1$, and the drain of the column select transistor 627 is coupled to conductor 629.

Alternative memory array device architectures may also be used with this invention. For example, U.S. Pat. No. 5,696,019 to Chang, incorporated herein by reference, discloses a memory device architecture suitable with this invention comprising a plurality of columns of memory cells sharing one or more bit lines. The architecture is based on a source-drain cell configuration in which each column of cells has a single buried diffusion local source line. An isolation structure such as a trench oxide is positioned between each column of cells.

Memory cell operation may be accomplished through one of several ways. In this embodiment, the memory cells are programmed by providing a first positive voltage value to the control gate and a second positive voltage valve to the buried drain diffusion, while the buried n-type source diffusion is at 0 volts. Under these conditions, electrons may tunnel from the valence band to the conduction band, leaving free holes in the valance bands. The voltage at the control gate attracts electrons towards the floating gate. The electrons are accelerated in the strong vertical electrical field between the drain diffusion and the control gate and a number of them become "hot" electrons with sufficient energy to be injected through a tunneling dielectric layer 106 (as shown by FIG. 1) into the floating gate 120 (FIG. 1).

Erasure is accomplished by F-N tunneling from the floating gate to the buried n-type source diffusion region. During erasure, a negative voltage is applied to the control gate, a positive voltage is applied to the source diffusion, and the drain is floating. As a result, F-N tunneling erasure of electrons from the floating gate to a source side will take place.

In other variations, a F-N tunneling programming (electron tunneling from floating gate to drain side through F-N tunneling) and channel erasing (electron from channel to floating gate through F-N tunneling) may be used. Still further, the memory cell may employ F-N tunneling programming (electron from channel to floating gate through F-N tunneling) and F-N channel erasing (electron from floating gate to channel by F-N tunneling).

Reading may be accomplished by providing a positive voltage to the drain diffusion and a positive voltage to the control gate, with the source at 0 volts. When the floating gate is charged, the threshold voltage for causing the n-channel transistor to conduct is decreased below the voltage applied to the control gate during a read operation. Thus a charged transistor will not conduct during a read operation and an uncharged transistor will conduct. The non-conducting state of the cell can be interpreted as a binary 1 or 0 depending on the polarity of the sensing circuitry.

The voltages required for programming, erasing, and/or reading operations depends in part on a coupling ratio between the floating gate and the control gate of the memory cell. The voltage across the floating gate may be characterized by the following equation:

$$V_{FG} = V_{CG}[C_{CR}/(C_{CR}+C_K)]$$

In the above equation, $C_{CR}$ is the capacitive couple ratio between the floating gate and the control gate. The factor $C_K$ represents the capacitive coupling of the floating gate across the tunnel oxide layer 206 for programming, erasing, or reading. As the above equation shows, the higher the coupling ratio between the floating gate and the control gate, the more equal the voltage across the floating gate is compared to the voltage across the control gate. As such, increasing the coupling ratio between the floating gate and the control gate decreases the voltage required to effectuate programming, erasing, or reading.

Some memory devices of the known art provide the floating gate with a greater coupling surface in order to increase the coupling ratio between the floating gate and the control gate. This has previously been accomplished by enlarging the lateral dimensions of the floating gate on the substrate. As such, the floating gates of the known art occupy a significant percentage of the real estate allocated on the memory array device. By contrast, this invention provides a comparable floating gate but having reduced lateral dimensions. More specifically, this invention provides for a floating gate having reduced later dimensions but which maintains or increases the coupling ratio between the floating gate and the control gate.

The foregoing description of preferred embodiments of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A method for forming a contoured floating gate for use in a floating gate memory cell, the method comprising:

forming masking structures including a masking layer in floating gate regions;

depositing oxide structures between the masking structures, whereby first and second spaced apart oxide structures are provided;

removing the masking layer in the floating gate region;

forming a polysilicon layer over the first and second spaced apart oxide structures and the floating gate region between the first and second oxide structures such that the polysilicon layer formed in the floating gate region has a first end region adjacent the first oxide structure, a second end region adjacent the second oxide structure, and a middle region positioned laterally between the first and second end regions, the first and second end regions each having a vertical thickness greater than a vertical thickness of the middle region; and removing a portion of the polysilicon layer in the floating gate region such that the vertical thickness of the first and second end regions remain greater than the vertical thickness of the middle region.

2. The method of claim 1, wherein forming a polysilicon layer over first and second spaced apart oxide structures and a floating gate region includes forming end regions of the floating gate to include an exterior surface, a top end surface adjacent the exterior surface, where the end regions have a substantially uniform thickness between the exterior surfaces and the respective interior surfaces.

3. The method of claim 1, wherein removing a portion of the polysilicon layer includes planarizing the first oxide structure, second oxide structure, first end region and second end region.

4. The method of claim 1, wherein top end surfaces of the first end region and the second end region are substantially parallel to a substrate underlying the floating gate.

5. The method of claim 1, wherein the floating gate is formed of a single polysilicon layer.

6. The method of claim 1, wherein the step of forming a polysilicon layer over first and second spaced apart oxide structures and a floating gate region includes forming the polysilicon layer between about 100 and 2000 Angstroms thick over the oxide structures.

7. The method of claim 6, wherein the step of forming a polysilicon layer over first and second spaced apart oxide structures and a floating gate region includes forming the polysilicon layer between about 300 and 1000 Angstroms thick over the oxide structures.

8. The method of claim 1, wherein the step of forming a polysilicon layer over first and second spaced apart oxide structures and a floating gate region includes forming the first end region and the second end region to have a vertical thickness ranging between about 100 and 10,000 Angstroms.

9. The method of claim 8, wherein the step of forming a polysilicon layer over first and second spaced apart oxide structures and a floating gate region includes forming the first end region and the second end region to have a vertical thickness ranging between about 1200 and 4000 Angstroms.

10. The method of claim 1, wherein the step of forming a polysilicon layer over first and second spaced apart oxide structures and a floating gate region includes forming the middle region to have a vertical thickness ranging between about 0 and 10,000 Angstroms.

11. The method of claim 10, wherein the step of forming a polysilicon layer over first and second spaced apart oxide structures and a floating gate region includes forming the middle region to have a vertical thickness ranging between about 0 and 3600 Angstroms.

12. The method of claim 1, wherein the step of forming a polysilicon layer over first and second spaced apart oxide structures and a floating gate region includes forming the middle region to have a lateral length ranging between about 100 and 6000 Angstroms.

13. The method of claim 12 wherein the step of forming a polysilicon layer over first and second spaced apart oxide structures and a floating gate region includes forming the middle region to have a lateral length ranging between about 1000 and 5000 Angstroms.

14. The method of claim 1, wherein the step of forming a polysilicon layer over first and second spaced apart oxide structures and a floating gate region includes forming the first and second end regions to have a lateral length ranging between about 100 and 2000 Angstroms.

15. The method of claim 14, wherein the step of forming a polysilicon layer over first and second spaced apart oxide structures and a floating gate region includes forming the first and second end regions to have a lateral length ranging between about 300 and 1000 Angstroms.

16. The method of claim 1, comprising prior to forming said polysilicon layer:

providing a substrate;

forming source and drain regions over the substrate;

depositing an insulating layer over the source and drain regions.

17. A method for forming a contoured floating gate for use in a floating gate memory cell, the method comprising:

forming a polysilicon layer over first and second spaced apart oxide structures and a floating gate region between the first and second oxide structures such that the polysilicon layer formed in the floating gate region has a first end region adjacent the first oxide structure, a second end region adjacent the second oxide structure, and a middle region positioned laterally between the first and second end regions, the first and second end regions each having a vertical thickness greater than a vertical thickness of the middle region; and removing a portion of the polysilicon layer in the floating gate region such that the vertical thickness of the first and second end regions remain greater than the vertical thickness of the middle region, further including removing a portion of the first and second oxide structures so that the first end region and the second end region extend vertically above the first and second oxide structures.

18. A method for forming a contoured floating gate for use in a floating gate memory cell, the method comprising:

forming a polysilicon layer over first and second spaced apart oxide structures and a floating gate region between the first and second oxide structures such that the polysilicon layer formed in the floating gate region has a first end region adjacent the first oxide structure, a second end region adjacent the second oxide structure, and a middle region positioned laterally between the first and second end regions, the first and second end regions each having a vertical thickness greater than a vertical thickness of the middle region; and removing a portion of the polysilicon layer in the floating gate region such that the vertical thickness of the first and second end regions remain greater than the vertical thickness of the middle region, wherein said polysilicon layer is formed by forming a first polysilicon layer and a second polysilicon layer over the first polysilicon layer, the second polysilicon layer having a thickness between about 100 and 2000 Angstroms over the middle region of the floating gate.

19. The method of claim 18, wherein forming a second polysilicon layer over the first polysilicon layer includes forming the second polysilicon layer to be between about 300 and 1000 Angstroms over the middle region of the floating gate.

20. The method of claim 18, wherein forming a first polysilicon layer in the floating gate region includes forming the first polysilicon layer between about 50 and 2000 Angstroms thick.

21. The method of claim 20, wherein forming a first polysilicon layer over a substrate includes forming a first polysilicon layer between about 400 and 1000 Angstroms thick.

22. The method of claim 18, further including removing a portion of the first and second oxide structures so that the first end region and the second end region extend vertically above the first and second oxide structures.

23. A method for forming a contoured floating gate for use in a floating gate memory cell, the method comprising:

forming a first polysilicon layer in a floating gate region of a substrate;

forming first and second oxide structures on opposing sides of the floating gate region, the first and second oxide structures having a vertical thickness greater than a vertical thickness of the first polysilicon layer; and forming a second polysilicon layer over the first and second oxide structures and the first polysilicon layer, the first and second polysilicon layers combining to form a floating gate in the floating gate region, the floating gate having a first end region adjacent to the first oxide structure, a second end region adjacent to the second oxide structure, and a middle region positioned laterally towards a middle of the floating gate relative to the first and second end regions, wherein the first end region and the second end region have a vertical thickness greater than a vertical thickness of the middle region; and removing the polysilicon layer over the first and second oxide structures to form the contoured floating gate.

24. The method of claim 23, further including removing a portion of the first and second oxide structures so that the first end region and the second end region extend vertically above the first and second oxide structures.

25. The method of claim 23, wherein forming a polysilicon layer over first and second spaced apart oxide structures and a floating gate region includes forming end regions of the floating gate to include an exterior surface, a top end surface adjacent the exterior surface, where the end regions have a substantially uniform thickness between the exterior surfaces and the respective interior surfaces.

26. The method of claim 25, wherein removing a portion of the polysilicon layer includes planarizing the first oxide structure, second oxide structure, first end region and second end region.

27. The method of claim 25, wherein top end surfaces of the first end region and the second end region are substantially parallel to a substrate underlying the floating gate.

28. The method of claim 23, comprising prior to forming said first polysilicon layer:

providing a substrate;

forming source and drain regions over the substrate;

depositing an insulating layer over the source and drain regions.

* * * * *